(12) United States Patent
Hu et al.

(10) Patent No.: US 10,991,827 B2
(45) Date of Patent: Apr. 27, 2021

(54) STRUCTURE OF OXIDE THIN FILM TRANSISTOR

(71) Applicant: TCL China Star Optoelectronics Technology Co., Ltd., Guangdong (CN)

(72) Inventors: Yutong Hu, Guangdong (CN); Chihyuan Tseng, Guangdong (CN); Chihyu Su, Guangdong (CN); Wenhui Li, Guangdong (CN); Xiaowen Lv, Guangdong (CN); Longqiang Shi, Guangdong (CN); Hejing Zhang, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 16/811,056

(22) Filed: Mar. 6, 2020

(65) Prior Publication Data
US 2020/0212225 A1 Jul. 2, 2020

Related U.S. Application Data

(62) Division of application No. 14/384,447, filed on Sep. 11, 2014, now Pat. No. 10,629,745.

(51) Int. Cl.
H01L 29/786 (2006.01)
H01L 29/06 (2006.01)
H01L 27/12 (2006.01)
H01L 29/66 (2006.01)

(52) U.S. Cl.
CPC ...... H01L 29/78606 (2013.01); H01L 27/127 (2013.01); H01L 27/1225 (2013.01); H01L 29/06 (2013.01); H01L 29/66969 (2013.01); H01L 29/786 (2013.01); H01L 29/7869 (2013.01); H01L 29/78696 (2013.01)

(58) Field of Classification Search
CPC . H01L 29/78606; H01L 29/786; H01L 29/06; H01L 27/1225; H01L 27/127; H01L 29/66969; H01L 29/7869; H01L 29/78696; H01L 29/41733; H01L 29/78618; H01L 29/41766
See application file for complete search history.

(56) References Cited

U.S. PATENT DOCUMENTS

2013/0092944 A1* 4/2013 Honda ............ H01L 21/02565
257/57

* cited by examiner

Primary Examiner — Hoang-Quan Ho
(74) Attorney, Agent, or Firm — Leong C. Lei

(57) ABSTRACT

A structure of an oxide thin film transistor includes: an oxide semiconducting layer, an etching stopper layer on the oxide semiconducting layer, and a source and a drain on the etching stopper layer. Two vias are formed in the etching stopper layer. The oxide semiconducting layer includes two recesses formed therein to extend through a skin layer of the oxide semiconducting layer and respectively corresponding to the two vias. The two recesses are respectively connected with and in communication with the two vias. The source and the drain are respectively filled in the two vias and the two recesses connected with the two vias to directly connect to and physically contact the oxide semiconducting layer.

4 Claims, 8 Drawing Sheets

STRUCTURE OF OXIDE THIN FILM TRANSISTOR

CROSS REFERENCE TO RELATED APPLICATIONS

This is a divisional application of co-pending patent application Ser. No. 14/384,447 filed on Sep. 11, 2014, which is a national stage of PCT Application No. PCT/CN2014/082126, filed on Jul. 14, 2014, claiming foreign priority of Chinese Patent Application No. 201410277587.0, filed on Jun. 19, 2014.

BACKGROUND OF THE INVENTION

1. Field of the Invention

The present invention relates to the field of flat panel displays, and more particularly to a structure of a thin film transistor backplane.

2. The Related Arts

A thin film transistor (TFT) has been widely utilized as a switching element and a driving element in an electronic device. Specifically, due to the possibility of formation of the thin film transistors on a glass substrate or a plastic substrate, they are commonly employed in the flat panel display field, such as a liquid crystal display (LCD), an organic light emitting diode (OLED), and etc.

The oxide semiconductor has higher electron mobility (the mobility of the oxide semiconductor is >10 $cm^2/Vs$ and the mobility of the amorphous silicon (a-Si) is merely 0.5-0.8 $cm^2/Vs$) and has a simpler manufacturing process in comparison with low temperature poly-silicon (LTPS) and higher compatibility in comparison with an amorphous silicon process. Therefore, it can be applied to the field of liquid crystal displays, organic light emitting displays, flexible displays, and the likes. Because it fits the new generation production lines and the possible applications in displays with large, middle and small sizes. The oxide semiconductor is hot to the research field of the present industry because the great opportunity of application development.

The oxide semiconductor has advantages of a higher electron mobility and a simpler manufacturing process. Nevertheless, some drawbacks exist. The stability is bad and big influence with temperature and humidity exists. The electric property of the oxide semiconductor drifts with time. The oxide semiconductor requires higher demands for process conditions, such as the film formation rate, the atmosphere and the temperature of the process, control of the temperature, etc. Besides, higher demands are further required for the isolation layer, the contact between the oxide semiconducting layer and the isolation layer, the contact between the oxide semiconducting layer and the metal layer. Restrict demanding the oxide semiconducting layer itself is not enough as regarding an oxide thin film transistor.

Referring to FIG. 1, which is a sectional view diagram of a structure of a bottom gate type oxide thin film transistor according to prior art, a manufacturing method of the structure of the oxide thin film transistor mainly comprises: step 1, providing a substrate (100); step 2, forming a gate (200) on the substrate (100); step 3, covering the gate (200) with a gate isolated layer (300); step 4, forming an oxide semiconducting layer (400) on the gate isolated layer (300); step 5, forming an etching stopper layer (500) on the oxide semiconducting layer (400); step 6, respectively forming two vias (510, 530) in the etching stopper layer (500) to expose the oxide semiconducting layer (400); step 7, forming a source (610) and a drain (630) on the etching stopper layer (500), wherein the source (610) fills in one via (510) and connects with the oxide semiconducting layer (400) and the drain (630) fills in the other via (530) and connects with the oxide semiconducting layer (400); step 8, forming a protective layer (700) on the source (610) and the drain (630) for covering the source (610) and the drain (630).

In the aforementioned manufacturing method of the oxide thin film transistor, the etching stopper layer (500) of step 5 is generally formed of a SiOx film layer, which is manufactured with TEOS+O2 or SiH4+N2O chemical vapor deposition. However, plasma will affect the surface property of the oxide semiconducting layer (400) when the film of the etching stopper layer (500) is formed. For instance, SiH4+N2O contains hydrogen which may combines with the oxygen in the oxide semiconducting layer (400) and leads into increase of the oxygen defects. As a result, the threshold voltage Vth tends to be negative. The oxygen in TEOS+O2 leads into decrease of the oxygen defects in the oxide semiconducting layer (400) and reduces the conductivity of the trench. Therefore, what contacts with the source (610) and the drain (630) is the damaged surface of the oxide semiconducting layer (400). Ultimately, the electrical property of the oxide thin film transistor is affected. Referring to FIG. 2, which is a curve diagram of the electrical property of an oxide thin film transistor according to prior art, the threshold voltage Vth=−5V and subthreshold swing S.S=0.45 when the voltage of the drain Vd=10V. The electrical property of the oxide thin film transistor can be worse.

SUMMARY OF THE INVENTION

An objective of the present invention is to provide a manufacturing method of an oxide thin film transistor. By using the manufacturing method, a source and a drain can contact an oxide semiconducting layer which is not damaged and remains the original property. The oxide thin film transistor formed by the manufacturing method possesses more stable and more excellent electrical property.

Another objective of the present invention is to provide a structure of oxide thin film transistor which possesses an excellent electrical property and improves the quality of the oxide thin film transistor.

To realize the aforesaid objectives, the present invention provides a manufacturing method of an oxide thin film transistor, comprising the following steps:

Step 1, providing a carrier;

Step 2, forming an oxide semiconducting layer on the carrier;

Step 3, forming an etching stopper layer on the oxide semiconducting layer;

Step 4, forming two vias in the etching stopper layer to expose the oxide semiconducting layer;

Step 5, removing a skin layer of the oxide semiconducting layer in the two vias to form two recesses respectively connecting the two vias;

Step 6, forming a source and a drain on the etching stopper layer, and the source fills one via and the recess connecting therewith to connect to the oxide semiconducting layer, and the drain fills the other via and the recess connecting therewith to connect to the oxide semiconducting layer.

The etching stopper layer is formed on the oxide semiconducting layer by chemical vapor deposition. The two vias are formed in the etching stopper layer by dry etching. The source and the drain are formed on the etching stopper layer by sputtering. The skin layer of the oxide semiconducting layer in the two vias are removed by dry etching or wet etching.

The etching stopper layer is a SiOx film layer formed with TEOS+O2 or SiH4+N2O chemical vapor deposition.

The carrier comprises a substrate, a gate formed on the substrate and a gate isolated layer formed on the substrate and the gate.

The manufacturing method of the oxide thin film transistor further comprises Step 7 of performing a post process, and the post process comprises forming a protective layer on the source and the drain to cover the source and the drain.

The carrier is a substrate.

The manufacturing method of the oxide thin film transistor further comprises Step 7 of performing a post process, and the post process comprises forming a gate isolated layer on the source and the drain, and sputtering a gate on the gate isolated layer.

The present invention further provides a structure of oxide thin film transistor, comprising: an oxide semiconducting layer, an etching stopper layer on the oxide semiconducting layer, and a source and a drain on the etching stopper layer, and two vias are formed in the etching stopper layer, and the oxide semiconducting layer comprises two recesses respectively corresponding to the two vias and the two recesses respectively connect with the two vias, and the source fills one via and the recess connecting therewith to connect to the oxide semiconducting layer, and the drain fills the other via and the recess connecting therewith to connect to the oxide semiconducting layer.

The structure of the oxide thin film transistor further comprises a substrate, a gate on the substrate, a gate isolated layer on the substrate and the gate, and a protective layer on the source and the drain; the oxide semiconducting layer is located on the gate isolated layer.

The structure of the oxide thin film transistor further comprises a substrate, a gate isolated layer on the source and the drain, and a gate on the gate isolated layer; the oxide semiconducting layer is located on the substrate.

The present invention further provides a structure of an oxide thin film transistor, comprising: an oxide semiconducting layer, an etching stopper layer on the oxide semiconducting layer, and a source and a drain on the etching stopper layer, and two vias are formed in the etching stopper layer, and the oxide semiconducting layer comprises two recesses respectively corresponding to the two vias and the two recesses respectively connect with the two vias, and the source fills one via and the recess connecting therewith to connect to the oxide semiconducting layer, and the drain fills the other via and the recess connecting therewith to connect to the oxide semiconducting layer; and the structure of the oxide thin film transistor further comprises a substrate, a gate on the substrate, a gate isolated layer on the substrate and the gate, and a protective layer on the source and the drain; the oxide semiconducting layer is located on the gate isolated layer.

The benefits of the present invention are: in the manufacturing method of an oxide thin film transistor according to the present invention, by performing dry etching or wet etching to a skin layer of an oxide semiconducting layer exposed in two vias, the skin layer of the oxide semiconducting layer, which the property is changed due to the damage of O and H of the plasma when the etching stopper layer is formed is removed, the source and the drain can contact the oxide semiconducting layer which is not damaged and remains the original property. The oxide thin film transistor formed by the manufacturing method possesses more stable and more excellent electrical property and the method is simple for operation. In the structure of the oxide thin film transistor according to the present invention, by locating two recesses in the oxide semiconducting layer corresponding to the two vias in the etching stopper layer, and the two recesses respectively connect with the two vias to allow the source and the drain contact the oxide semiconducting layer which remains the original property. Accordingly, fine electrical property is achievable and the quality of the oxide thin film transistor can be promoted.

BRIEF DESCRIPTION OF THE DRAWINGS

In order to better understand the characteristics and technical aspect of the invention, reference is made to the following detailed description of the present invention in combination with the drawings; however, the drawings and the description are provided only for reference and are not intended to limit the invention.

In drawings.

DETAILED DESCRIPTION OF PREFERRED EMBODIMENTS

Figure 1:
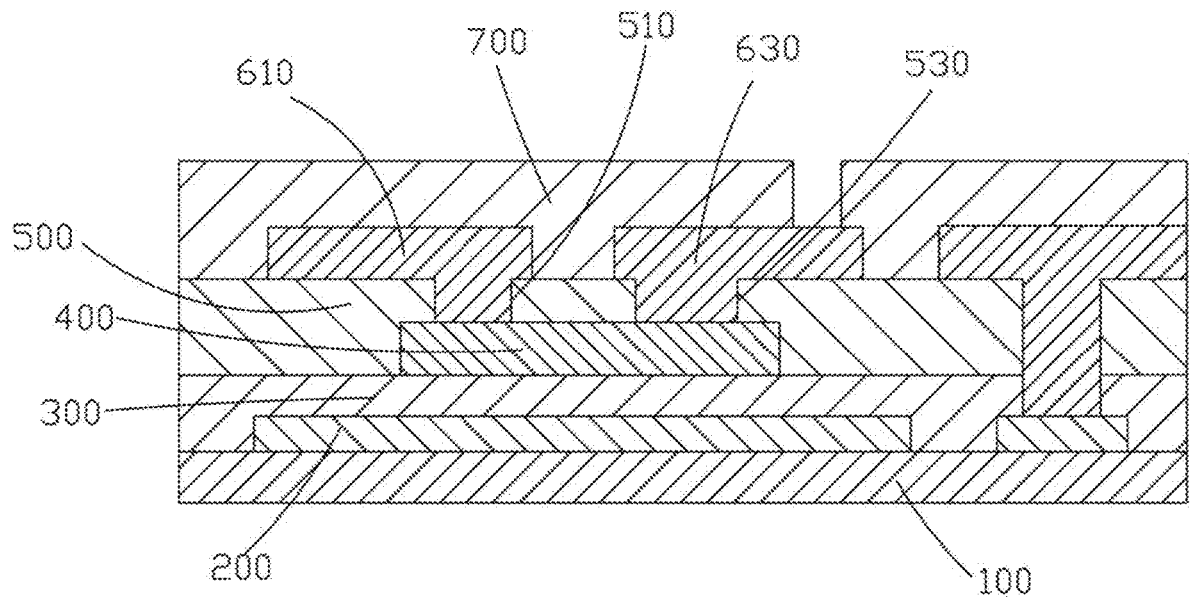
FIG. 1 is a sectional view of a structure of an oxide thin film transistor according to prior art.
Figure 2:
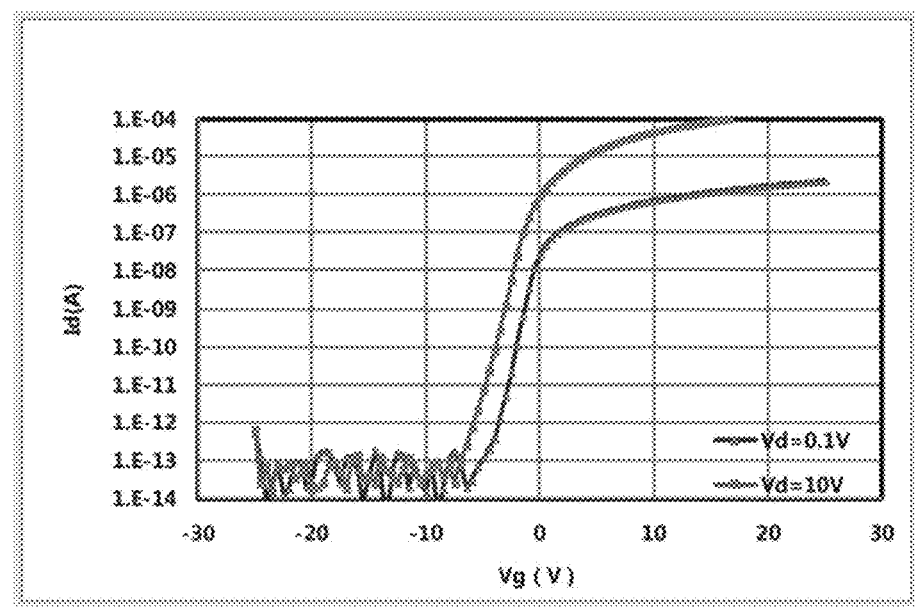
FIG. 2 is a curve diagram of the electrical property of an oxide thin film transistor according to prior art.
Figure 3:
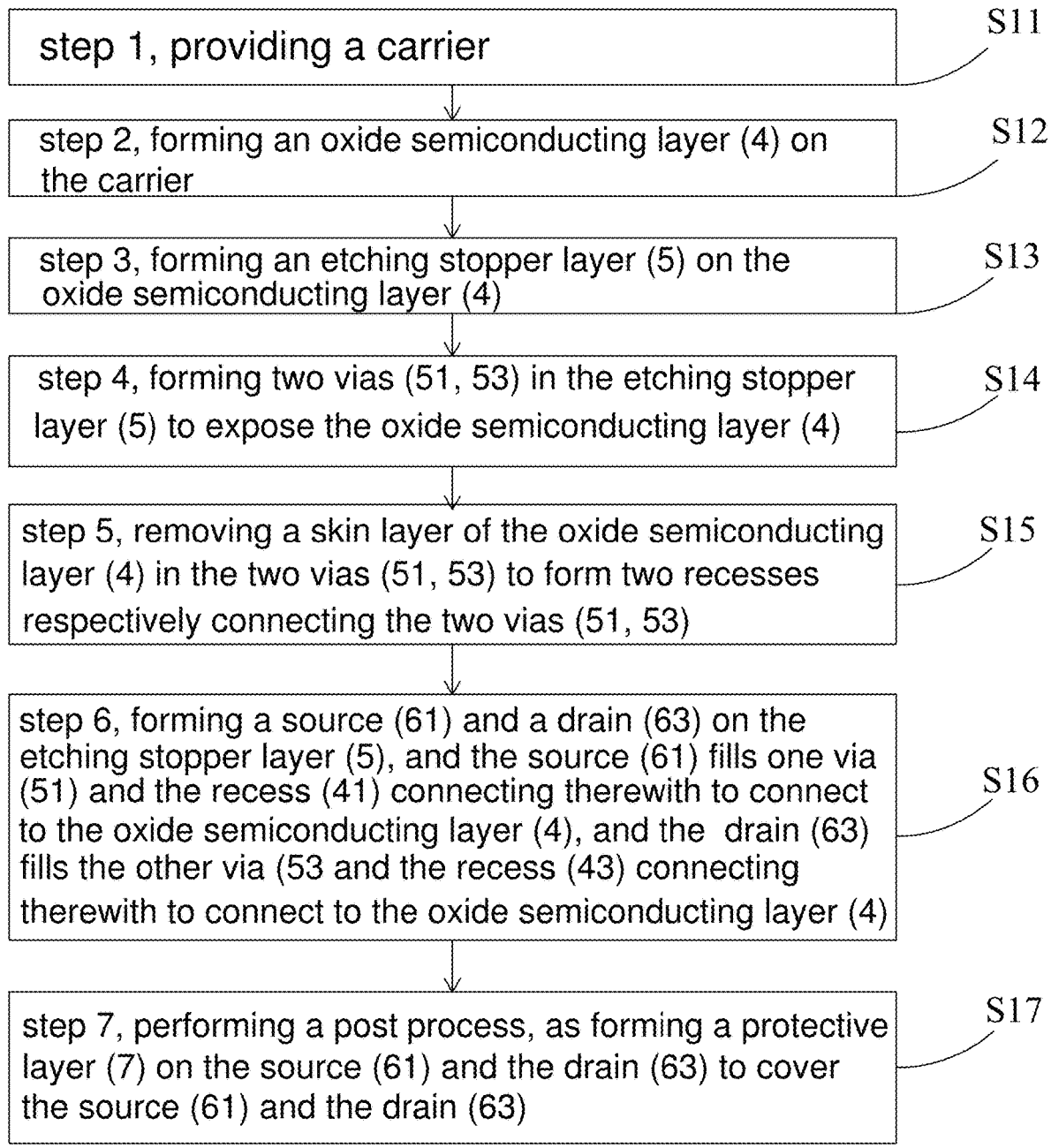
FIG. 3 is a flowchart of a manufacturing method of an oxide thin film transistor according to a first embodiment of the present invention.
Figure 4:
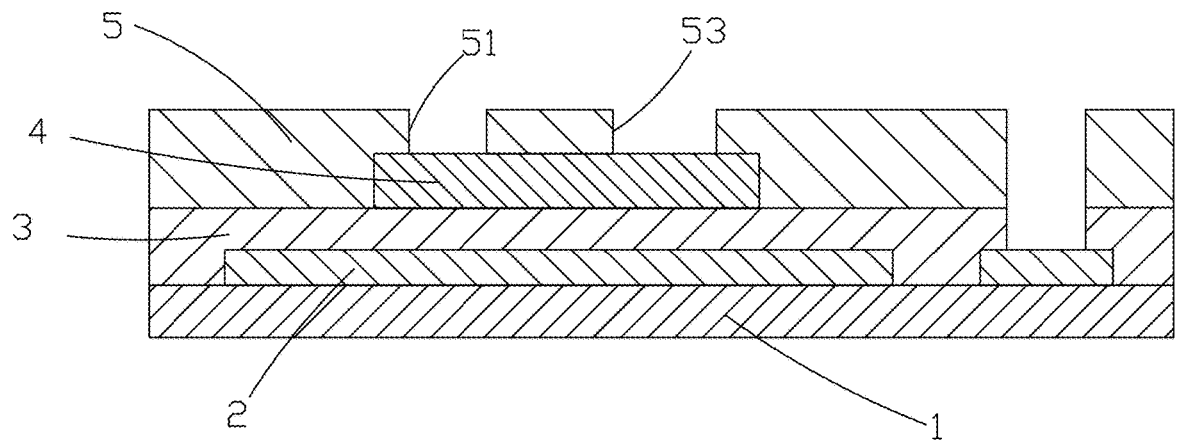
FIG. 4 is a diagram of Step S14 of the manufacturing method of the structure of the oxide thin film transistor according to the first embodiment of the present invention.
Figure 5:
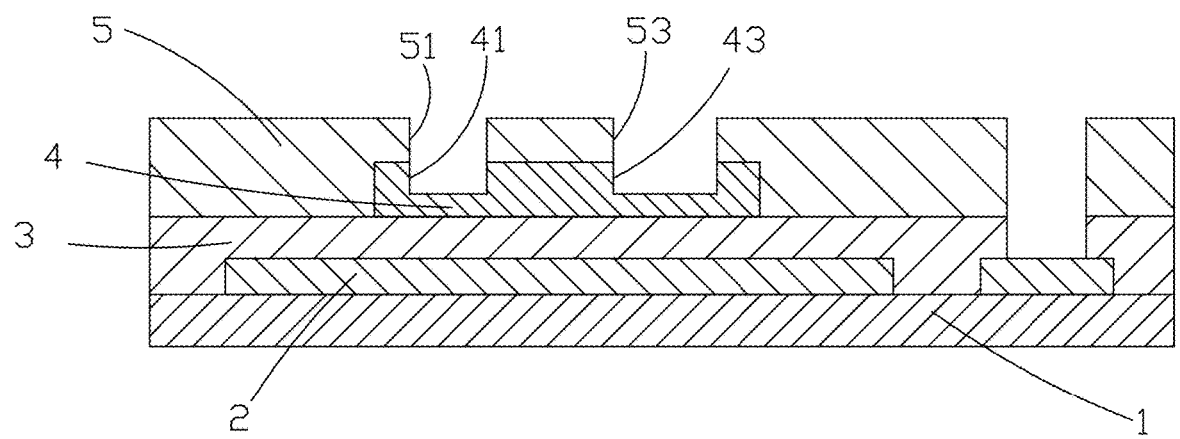
FIG. 5 is a diagram of Step S15 of the manufacturing method of the structure of the oxide thin film transistor according to the first embodiment of the present invention.
Figure 6:
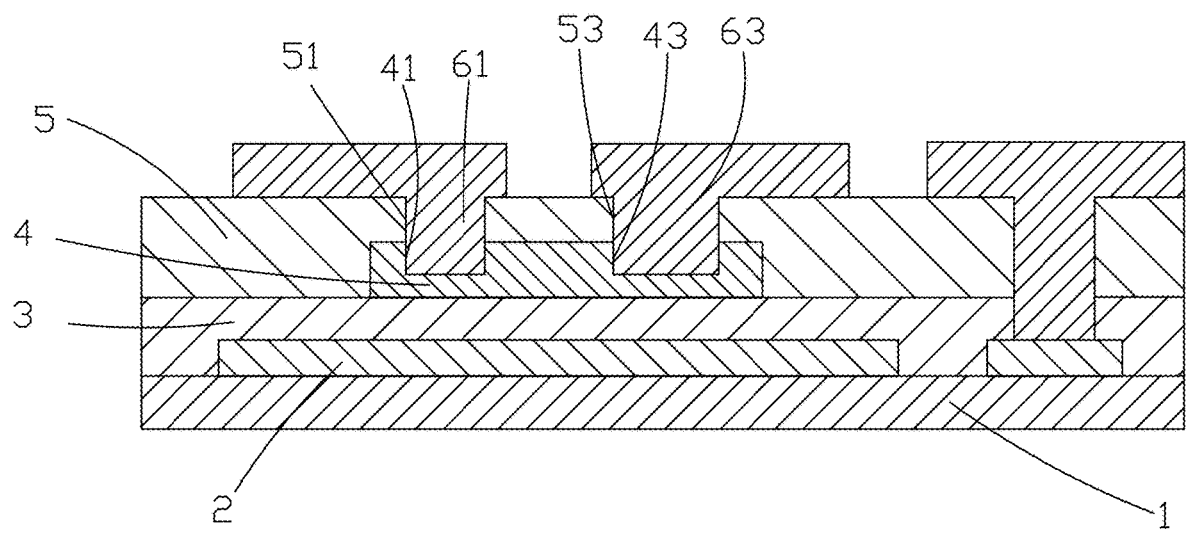
FIG. 6 is a diagram of Step S16 of the manufacturing method of the structure of the oxide thin film transistor according to the first embodiment of the present invention.

Embodiments of the present invention will described in detail regarding the technical matters, structural features, achieved objects, and effects with reference to the accompanying drawings.

Referring to FIGS. 3-7, which show a manufacturing method of an oxide thin film transistor according to a first embodiment of the present invention, the manufacturing method of the first embodiment is applicable to a bottom gate type thin film transistor. The manufacturing method comprises the following steps:

Step S11, providing a carrier.

In the first embodiment, the carrier comprises a substrate 1, a gate 2 formed on the substrate 1 and a gate isolated layer 3 formed on the substrate 1 and the gate 2. Preferably, the substrate 1 is a glass substrate.

Step S12, forming an oxide semiconducting layer 4 on the carrier.

Preferably, a material of the oxide semiconducting layer 4 is indium gallium zinc oxide semiconducting (IGZO).

Step S13, forming an etching stopper layer 5 on the oxide semiconducting layer 4.

The etching stopper layer 5 is formed on the oxide semiconducting layer 4 by chemical vapor deposition. Furthermore, the etching stopper layer 5 is a SiOx film layer formed with TEOS+O2 or SiH4+N2O chemical vapor deposition.

Step S14, forming two vias 51, 53 in the etching stopper layer 5 to expose the oxide semiconducting layer 4.

In Step S14, the two vias 51, 53 are formed in the etching stopper layer 5 by dry etching.

Step S15, removing a skin layer of the oxide semiconducting layer 4 in the two vias 51, 53 to form two recesses respectively connecting the two vias 51, 53.

In Step S15, the skin layer of the oxide semiconducting layer 4 in the two vias 51, 53 are removed by dry etching or wet etching.

In the formation process of the etching stopper layer 5, the skin layer of the oxide semiconducting layer 4 suffers damage caused by O and H of plasma, resulting in that the property of the skin layer of the oxide semiconducting layer 4 has been changed. With Step S15, the skin layer of the oxide semiconducting layer 4, which the property is changed due to the damage of O and H of the plasma is removed. The new formed skin layer of the oxide semiconducting layer 4 respectively in the recesses 41, 43 connecting with the two vias 51, 53 is undamaged and possesses the original property of the oxide semiconducting layer 4.

Step S16, forming a source 61 and a drain 63 on the etching stopper layer 5, and the source 61 fills one via 51 and the recess 41 connecting therewith to connect to the oxide semiconducting layer 4, and the drain 63 fills the other via 53 and the recess 43 connecting therewith to connect to the oxide semiconducting layer 4.

Specifically, the source 61 and the drain 63 are formed on the etching stopper layer 5 by sputtering.

The source 61 and the drain 63 contact the oxide semiconducting layer 4 which remains the original property because the skin layer of the oxide semiconducting layer 4 in the recesses 41, 43 is not damaged and remains the original property.

Step S17, performing a post process, as forming a protective layer 7 on the source 61 and the drain 63 to cover the source 61 and the drain 63.

Figure 8:
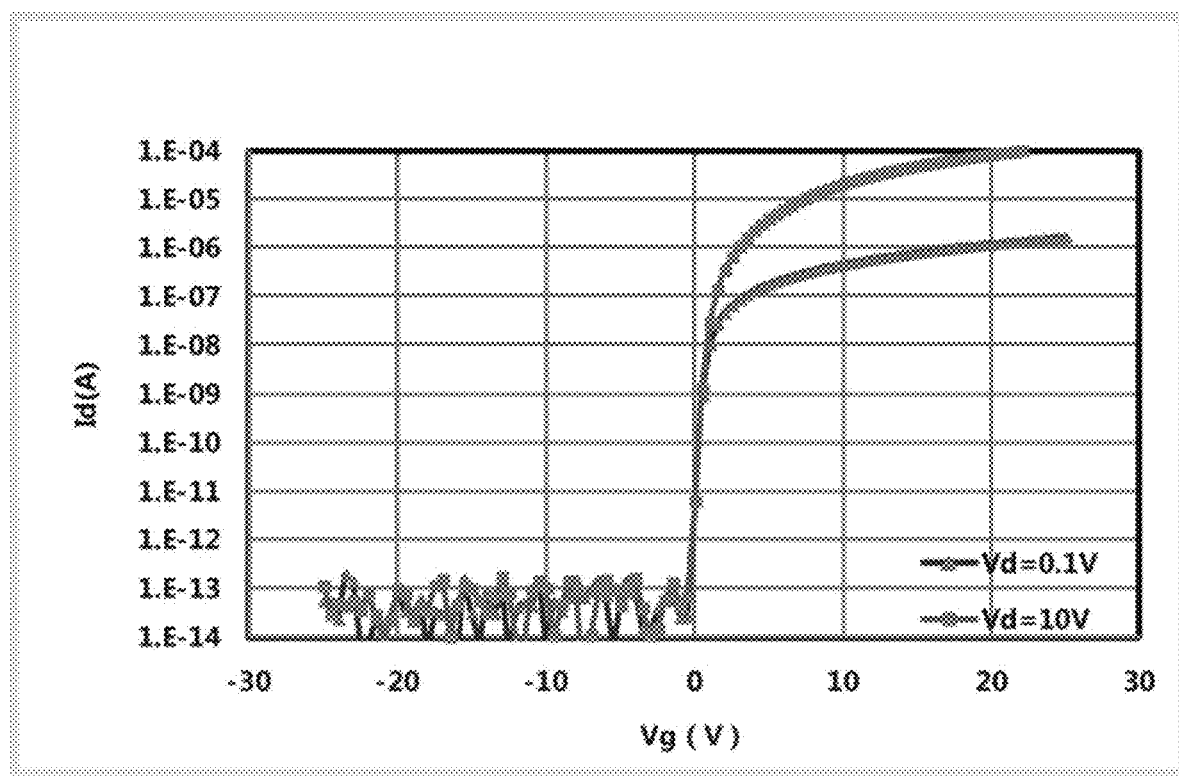
FIG. 8 is a curve diagram of the electrical property of an oxide thin film transistor according to the present invention.
Figure 9:
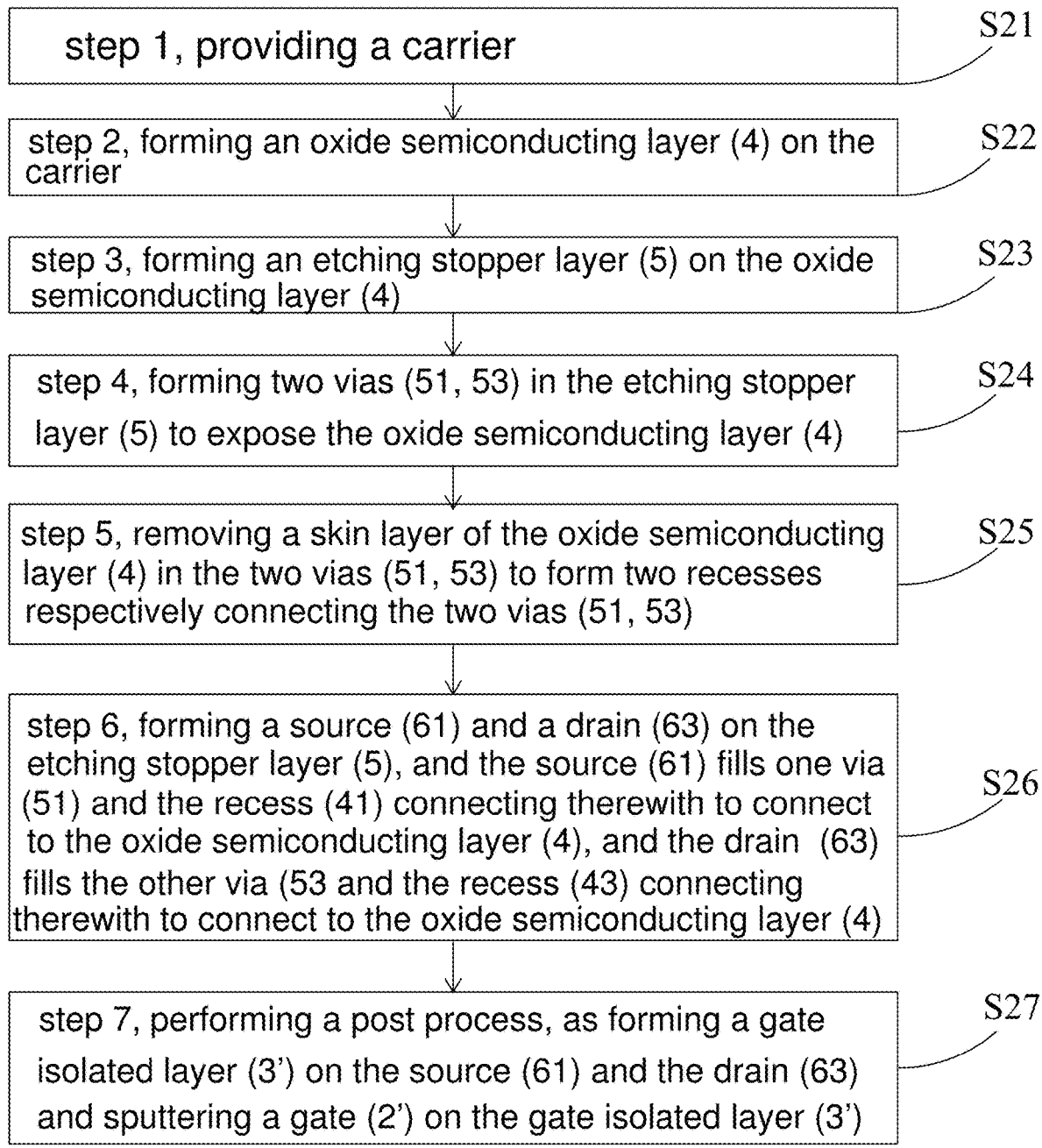
FIG. 9 is a flowchart of a manufacturing method of an oxide thin film transistor according to a second embodiment of the present invention.
Figure 10:
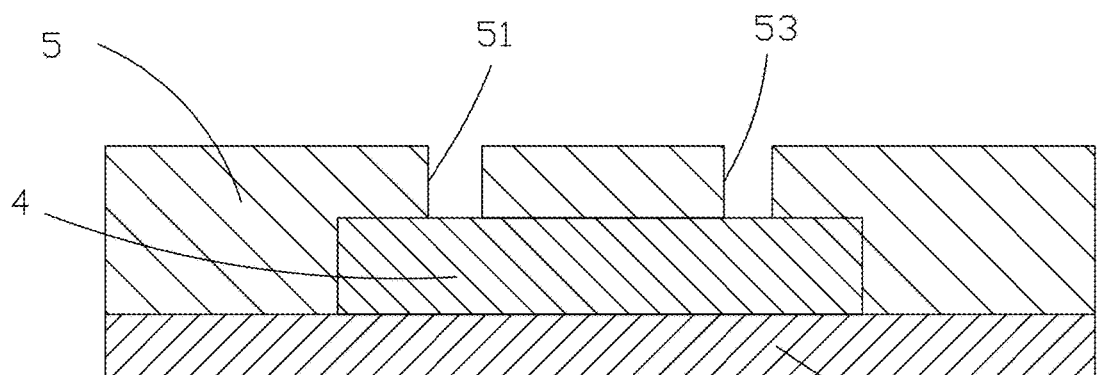
FIG. 10 is a diagram of Step S23 of the manufacturing method of the oxide thin film transistor according to the second embodiment of the present invention.
Figure 11:
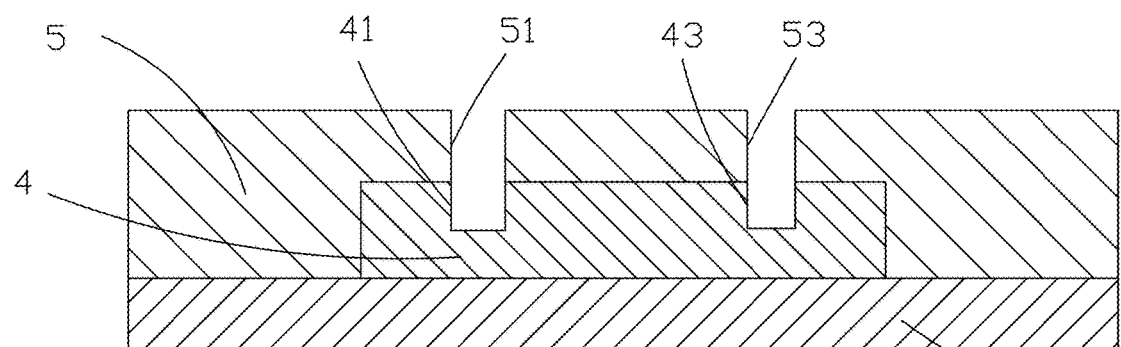
FIG. 11 is a diagram of Step S24 of the manufacturing method of the oxide thin film transistor according to the second embodiment of the present invention.
Figure 12:
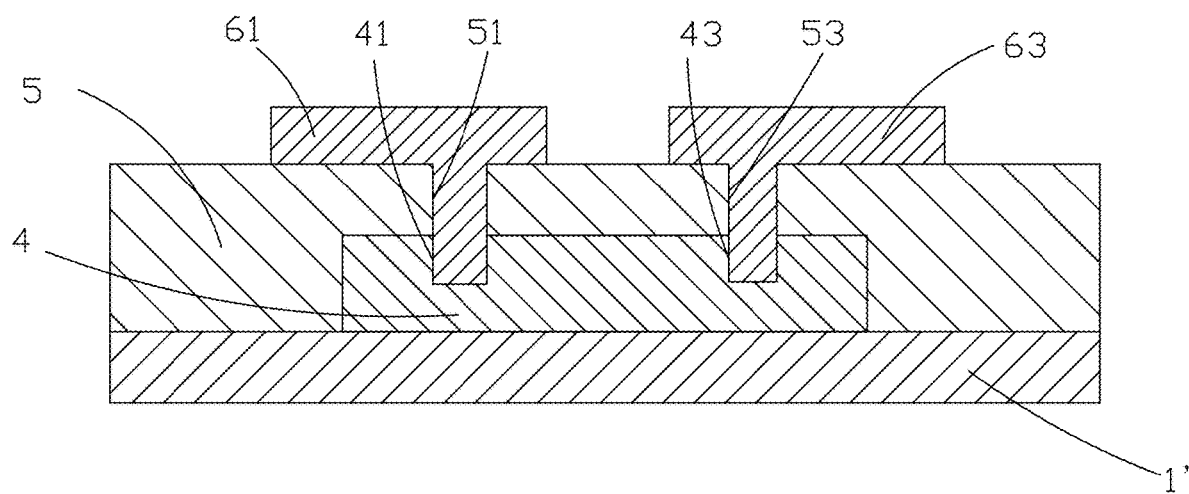
FIG. 12 is a diagram of Step S25 of the manufacturing method of the oxide thin film transistor according to the second embodiment of the present invention.
Figure 13:
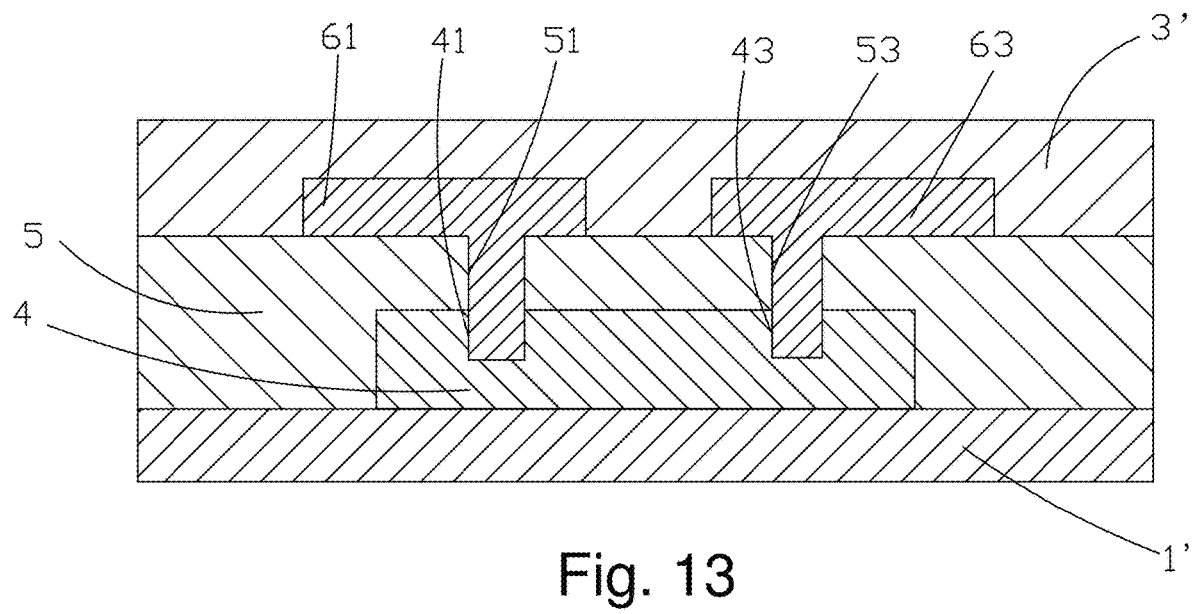
FIG. 13 is a diagram of Step S26 of the manufacturing method of the oxide thin film transistor according to the second embodiment of the present invention.

Referring to FIG. 8, which is a curve diagram of the electrical property of an oxide thin film transistor formed by the aforesaid manufacturing method of the oxide thin film transistor, as shown in the figure, the threshold voltage Vth=0.2V and subthreshold swing S.S=0.13 as the voltage of the drain Vd=10V. The subthreshold swing S.S becomes smaller as the threshold voltage Vth is near around the 0V. The electrical property of the oxide thin film transistor formed by the manufacturing method of the structure of the oxide thin film transistor according to the present invention gets considerable and significant improvement.

Referring to FIGS. 9-14, which show a manufacturing method of an oxide thin film transistor according to a second embodiment of the present invention. The manufacturing method of the second embodiment is applicable to a top gate type thin film transistor. The differences of the second embodiment from the first embodiment are provided below:

Step S21, providing a carrier.

In the second embodiment, the carrier is a substrate 1'. The substrate 1' is a transparent substrate. Preferably, the substrate 1' is a glass substrate.

Step S27, performing a post process, as forming a gate isolated layer 3' on the source 61 and the drain 63 and sputtering a gate 2' on the gate isolated layer 3'.

The remaining steps, Steps S22-S26, which are carried sequentially after Step S21 and before Step S27 are the same as the counterpart steps, Steps S12-S16, of the first embodiment. Repeated description of these steps will not be necessary herein.

On the basis of a manufacturing method of an oxide thin film transistor, the present invention further provides a structure of an oxide thin film transistor, which is applicable to a LCD apparatus or a OLED apparatus.

Figure 7:
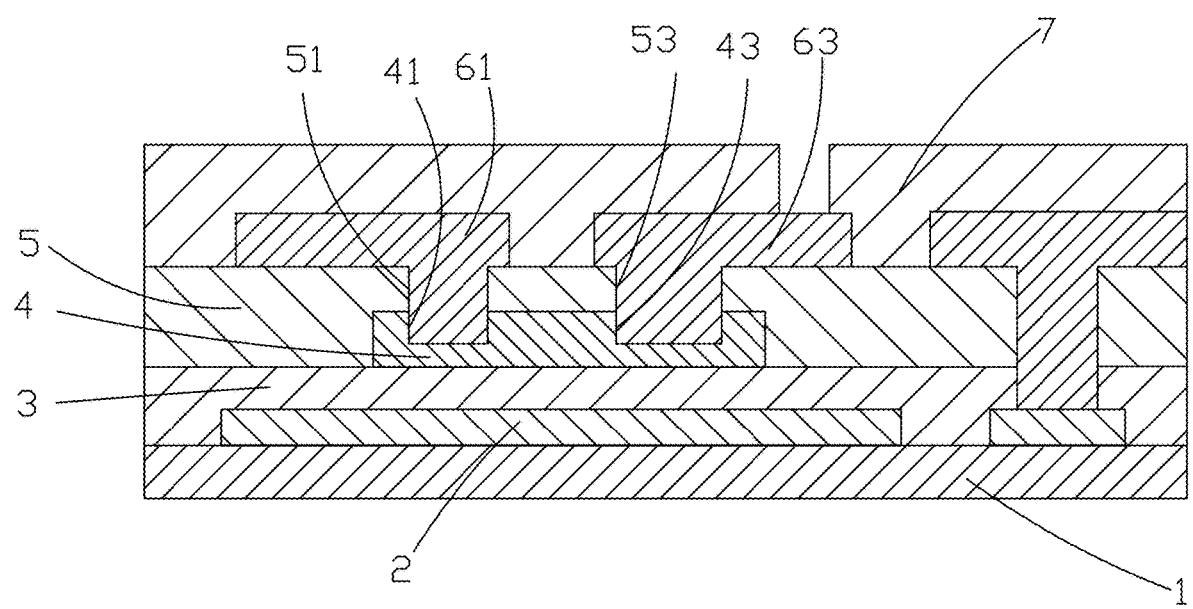
FIG. 7 is a diagram of Step S17 of the manufacturing method of the structure of the oxide thin film transistor according to the first embodiment of the present invention and is also a sectional view of a structure of the oxide thin film transistor according to the first embodiment of the present invention.

Referring to FIG. 7, which is a sectional view of a structure of an oxide thin film transistor according to a first embodiment of the present invention, in the first embodiment, the structure of the oxide thin film transistor, which belongs to a bottom gate type, comprises an oxide semiconducting layer 4, an etching stopper layer 5 on the oxide semiconducting layer 4, and a source 61 and a drain 63 on the etching stopper layer 5, wherein two vias 51, 53 are formed in the etching stopper layer 5; the oxide semiconducting layer 4 comprises two recesses 41, 43 respectively corresponding to the two vias 51, 53 and the two recesses 41, 43 respectively connect with the two vias 51, 53; and the source 61 fills one via 51 and the recess 41 connecting therewith to connect to the oxide semiconducting layer 4, and the drain 63 fills the other via 53 and the recess 43 connecting therewith to connect to the oxide semiconducting layer 4. The structure of the oxide thin film transistor further comprises a substrate 1, a gate 2 on the substrate 1, a gate isolated layer 3 on the substrate 1 and the gate 2, and a protective layer 7 on the source 61 and the drain 63. The oxide semiconducting layer 4 is located on the gate isolated layer 3. Significantly, the two recesses 41, 43 allow the source 61 and the drain 63 to contact the oxide semiconducting layer 4, which remains the original property. Therefore, fine electrical property can be achieved.

Figure 14:
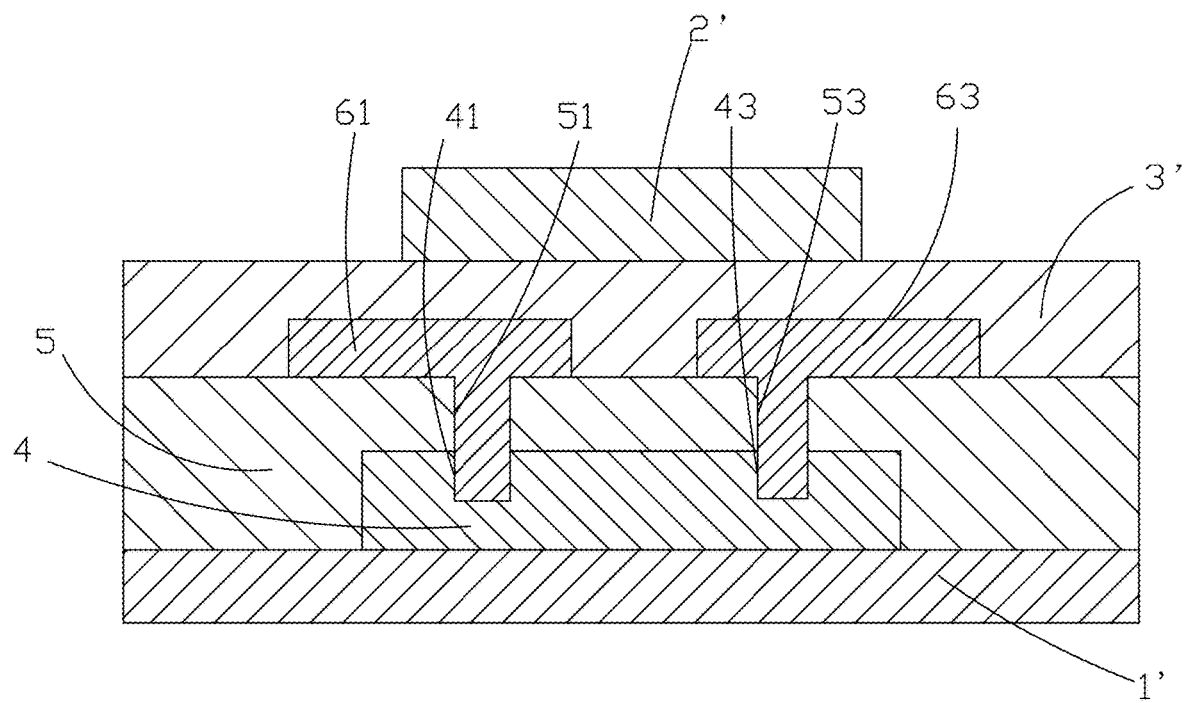
FIG. 14 is a diagram of Step S27 of the manufacturing method of the oxide thin film transistor according to the second embodiment of the present invention and is also a sectional view of a structure of an oxide thin film transistor according to a second embodiment of the present invention.

Referring to FIG. 14, which is a sectional view showing a structure of an oxide thin film transistor according to a second embodiment of the present invention, in the second embodiment, the structure of the oxide thin film transistor belongs to a top gate type. Differences of the second embodiment from the first embodiment are that the second embodiment further comprises a substrate 1', a gate isolated layer 3' on the source and the drain, and a gate 2' on the gate isolated layer 3'; and the oxide semiconducting layer 4 is located on the substrate 1'. Other structures are the same as those described in the first embodiment. Repeated explanation will be omitted here.

In conclusion, in the manufacturing method of an oxide thin film transistor according to the present invention, by performing dry etching or wet etching to a skin layer of an oxide semiconducting layer exposed in two vias, the skin layer of the oxide semiconducting layer, of which the property is changed due to the damage of O and H of plasma when the etching stopper layer is formed, is removed, and the source and the drain can contact the oxide semiconducting layer which is not damaged and remains the original property. The oxide thin film transistor formed by the manufacturing method possesses more stable and more excellent electrical property and the method is simple for operation. In the structure of the oxide thin film transistor according to the present invention, by locating two recesses in the oxide semiconducting layer corresponding to the two vias in the etching stopper layer, and the two recesses respectively connect with the two vias to allow the source and the drain contact the oxide semiconducting layer which remains the original property. Accordingly, fine electrical property is achievable and the quality of the oxide thin film transistor can be promoted.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A structure of an oxide thin film transistor, comprising: an oxide semiconducting layer, an etching stopper layer on the oxide semiconducting layer, and a source and a drain on the etching stopper layer,
    wherein the oxide semiconducting layer has a body exhibiting a predetermined original material property of semiconduction and a skin layer, which is a unitary part of the oxide semiconducting layer and defines a surface of the oxide semiconducting layer, the skin layer having a modified material property of semiconduction that is different from the predetermined original material property of semiconduction and extends inward from a top face of the oxide semiconducting layer;
    two vias are formed in the etching stopper layer and the oxide semiconducting layer comprises two recesses formed in the surface of the oxide semiconducting layer and extending from the top face of the oxide semiconducting layer to run completely through the skin layer and penetrate into the body of the oxide semiconducting layer, wherein the two recesses respectively correspond to the two vias, and the two recesses are extended through the skin layer into an interior of the body so as to expose a part of the body that exhibits the predetermined original material property of semiconduction; and
    the two recesses are respectively connected with and in communication with the two vias, the source being filled in a first one of the vias and a first one of the recesses that is connected with the first via to connect to and physically contact the part of the body of the oxide semiconducting layer that exhibits the predetermined original material property of semiconduction, the drain being filled in a second one of the vias and a second one of the recesses connected with the second via to connect to and physically contact the part of the body of the oxide semiconducting layer that exhibits the predetermined original material property of semiconduction, wherein the source and the drain are both connected to the part of the body of the oxide semiconducting layer that exhibits the predetermined original material property of semiconduction, and the source and the drain are connected to each other by a portion of the body of the oxide semiconducting layer that exhibits the predetermined original material property of semiconduction.

2. The structure of the oxide thin film transistor according to claim 1, further comprising a substrate, a gate on the substrate, a gate isolated layer on the substrate and the gate, and a protective layer on the source and the drain, the oxide semiconducting layer being located on the gate isolated layer.

3. The structure of the oxide thin film transistor according to claim 1, further comprising a substrate, a gate isolated layer on the source and the drain, and a gate on the gate isolated layer, the oxide semiconducting layer being located on the substrate.

4. A structure of an oxide thin film transistor, comprising: an oxide semiconducting layer, an etching stopper layer on the oxide semiconducting layer, and a source and a drain on the etching stopper layer,
    wherein the oxide semiconducting layer has a body exhibiting a predetermined original material property of semiconduction and a skin layer, which is a unitary part of the oxide semiconducting layer and defines a surface of the oxide semiconducting layer, the skin layer having a modified material property of semiconduction that is different from the predetermined original material property of semiconduction and extends inward from a top face of the oxide semiconducting layer;
    two vias are formed in the etching stopper layer and the oxide semiconducting layer comprises two recesses formed in the surface of the oxide semiconducting layer and extending from the top face of the oxide semiconducting layer to run completely through the skin layer and penetrate into the body of the oxide semiconducting layer, wherein the two recesses respectively correspond to the two vias, and the two recesses are extended through the skin layer to penetrate into an interior of the body so as to expose a part of the interior of the body that exhibits the predetermined original material property of semiconduction; and
    the two recesses are respectively connected with and in communication with the two vias, the source being filled in a first one of the vias and a first one of the recesses that is connected with the first via to connect to and physically contact the part of the body of the oxide semiconducting layer that exhibits the predetermined original material property of semiconduction, the drain being filled in a second one of the vias and a second one of the recesses connected with the second via to connect to and physically contact the part of the body of the oxide semiconducting layer that exhibits the predetermined original material property of semiconduction, wherein the source and the drain are both connected to the part of the body of the oxide semiconducting layer that exhibits the predetermined original material property of semiconduction, and the source and the drain are connected to each other by a portion of the body of the oxide semiconducting layer that exhibits the predetermined original material property of semiconduction; and wherein the structure of the oxide thin film transistor further comprises a substrate, a gate on the substrate, a gate isolated layer on the substrate and the gate, and a protective layer on the source and the drain, the oxide semiconducting layer being located on the gate isolated layer.

* * * * *